(12) United States Patent  
Abe

(10) Patent No.: US 6,967,290 B2
(45) Date of Patent: Nov. 22, 2005

(54) CIRCUIT BOARD

(75) Inventor: Takashi Abe, Tokyo (JP)

(73) Assignee: NEC Corporation, Tokyo (JP)

( * ) Notice: Subject to any disclaimer, the term of this patent is extended or adjusted under 35 U.S.C. 154(b) by 282 days.

(21) Appl. No.: 10/231,322

(22) Filed: Aug. 30, 2002

(65) Prior Publication Data

US 2003/0043552 A1   Mar. 6, 2003

(30) Foreign Application Priority Data

Sep. 3, 2001 (JP) ............................... 2001-265818

(51) Int. Cl.⁷ ............................ H05K 7/00; H05K 7/06
(52) U.S. Cl. ...................... 174/250; 174/255; 174/260
(58) Field of Search .................... 361/748–751, 361/760, 761, 782, 783; 174/250, 253–268; 29/729, 739–741, 762, 825, 832–834, 846

(56) References Cited

U.S. PATENT DOCUMENTS

| | | | | |
|---|---|---|---|---|
| 5,614,698 A | * | 3/1997 | Estes .......................... | 174/250 |
| 5,740,066 A | * | 4/1998 | Suppelsa et al. ............... | 716/1 |
| 6,158,119 A | * | 12/2000 | Crist et al. .................... | 29/840 |
| 6,191,366 B1 | * | 2/2001 | Onishi et al. ................ | 174/250 |
| 6,225,141 B1 | * | 5/2001 | Wenner et al. ................ | 438/54 |
| 6,403,891 B1 | * | 6/2002 | Banerjee et al. ............ | 174/250 |
| 6,512,180 B2 | * | 1/2003 | Nakagawa ................... | 174/250 |
| 6,549,419 B1 | * | 4/2003 | Nakano et al. ............. | 361/749 |

FOREIGN PATENT DOCUMENTS

| | | | | |
|---|---|---|---|---|
| JP | 62-40861 U | 3/1987 | | |
| JP | 01-139475 U | 9/1989 | | |
| JP | 03-181190 A | 8/1991 | | |
| JP | 3-289189 A | 12/1991 | | |
| JP | 03-289189 A | * 12/1991 | ............ | H05K 1/02 |
| JP | 05-218601 A | * 8/1993 | ............ | H05K 1/02 |
| JP | 05-299789 A | 11/1993 | | |
| JP | 06-045798 A | * 2/1994 | .......... | H05K 13/04 |

* cited by examiner

Primary Examiner—John B. Vigushin
(74) Attorney, Agent, or Firm—Sughrue Mion, PLLC

(57) ABSTRACT

A circuit board permits common use of the same circuit board without separately manufacturing the circuit board per providing destinations when similar circuit boards are manufactured for a plurality of providing destinations in the same factory. The circuit board has at least a first providing destination indicating region on which a first providing destination is indicated and a second providing destination indicating region located adjacent the first providing destination indicating region and having a second providing destination indicated thereon, the providing destination indicating regions other than that indicating an intended providing destination being hidden by mounting parts thereon.

11 Claims, 6 Drawing Sheets

CIRCUIT BOARD

BACKGROUND OF THE INVENTION

1. Field of the Invention

The present invention relates generally to a circuit board. More particularly, the invention relates to a circuit board to be supplied to a plurality of destinations.

2. Description of the Related Art

Conventionally, in the circuit board, a providing destination, such as maker name or the like, a mold number, an acquisition standard and so forth are indicated by silk print.

In Japanese Unexamined Patent Publication No. 3-289189, in a printed circuit board which can mount a circuit protecting fuse, in order to adapt to difference of specification of the fuse depending upon destination (country), two rating indication portions respectively indicating ratings of fuses are provided on end portions of the printed circuit board in such a manner that respective rating indicating portion can be removable along a perforation defined by aligned small holes. Then, one of the rating indicating portions is removed with leaving the other adapted to the rating of the actual destination, for shipping to the destination.

However, in the printed circuit board set forth above, no consideration has been given for indicating a plurality of providing destination (maker name, vender name and so forth). Also, when the unnecessary one of the rating indicating portion is cut off along the perforation, since the perforation is by aligned small holes, the cut portion should form unevenness.

In the meantime, in OEM (original Equipment Manufacturing) business of the circuit board (mother board), the following operations are taken place.

A company A assembles the own circuit board (mother board) manufactured by itself in own apparatus manufactured by itself and ships the apparatus.

A company B purchases the mother boards from the company A to ship the mother boards to companies C and D as own circuit boards manufactured by itself. The companies C and D purchased the mother board from the company B assembles the same in own apparatus and ship the apparatus.

In such case, for the company B, presence of indication of provider taking the company A as maker is not favorable for the company B in view point of shipping such mother boards to other companies, i.e. companies C and D as own products. For this reason, the company A, under request of the company B, separately manufactures two kinds of circuit boards for own use and for the company B.

Namely, when similar circuit boards for a plurality of providing destinations are manufactured in one factory, the circuit boards for respective providing destinations are manufactured separately for differentiating the maker name.

SUMMARY OF THE INVENTION

The present invention has been worked out in view of the inconvenience is the prior art. It is therefore an object of the present invention to permit common use of the same circuit board without separately manufacturing the circuit board per providing destinations when similar circuit boards are manufactured for a plurality of providing destinations in the same factory.

According to one aspect of the present invention, a circuit board having at least a first providing destination indicating region on which a first providing destination is indicated and a second providing destination indicating region located adjacent the first providing destination indicating region and having a second providing destination indicated thereon, and part mounting portions provided in respective of the providing destination indicating regions, wherein part mounting portions are designed for receiving parts for hiding providing destinations indicated on corresponding providing destination indicating region.

A plurality of part mounting portions may be provided for selectively mounting the parts on the providing destination indicating regions other than that indicating an intended providing destination. Preferably, the part mounting portions may be provided on both ends of respective providing destination indicating regions.

The parts mounted on the providing destination indicating regions other than that indicating an intended providing destination, may form a part of a circuit together with other parts. In the alternative, the parts mounted on the providing destination indicating regions other than that indicating an intended providing destination, may be dummy parts not forming a part of a circuit.

In addition, manufacturing information depending upon respective providing destination may be indicated in respective providing destination indicating regions. The manufacturing information in each providing destination indicating region may be a bar code. Furthermore, a test circuit adapted to each providing destination may be embedded in each providing destination indicating region.

According to the second aspect of the present invention, a circuit board has at least a first providing destination indicating region on which a first providing destination is indicated and a second providing destination indicating region located adjacent the first providing destination indicating region, on which second providing destination region, a second providing destination is indicated, the first and second providing destination indicating regions are defined by thinned portion extending along boundaries of respective of the providing destination indicating regions so that the providing destination indicating regions other than that indicating an intended providing destination being are removed.

In addition, manufacturing information depending upon respective providing destination may be indicated in respective providing destination indicating regions. The manufacturing information in each providing destination indicating region may be a bar code. Furthermore, a test circuit adapted to each providing destination may be embedded in each providing destination indicating region.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessary obscurity of the present invention.

Figure 1:
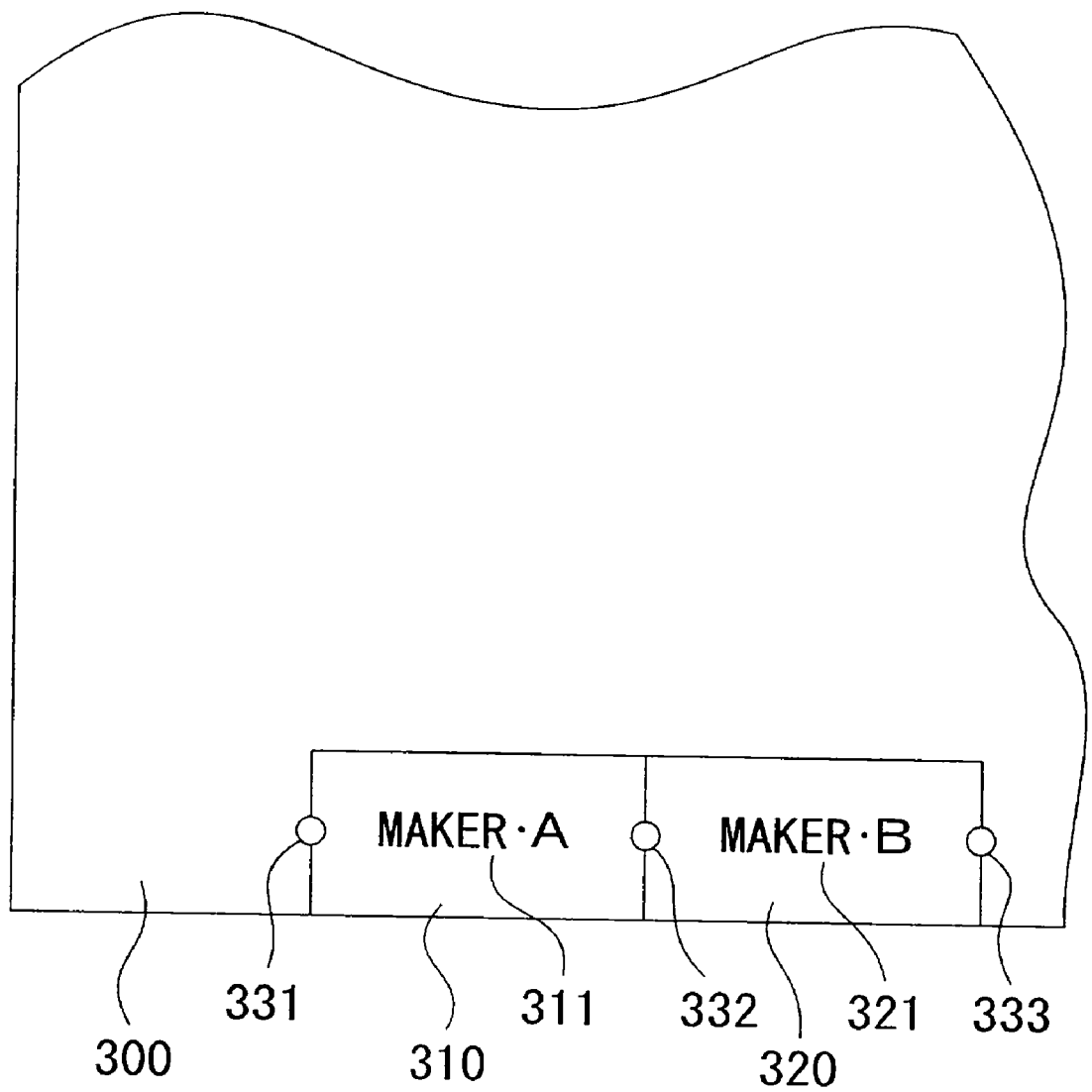
FIG. 1 is a plan view of major portion of the preferred embodiment of a circuit board according to the present invention illustrated in a condition before a provider indication is hidden by parts.

Referring to FIG. 1, a circuit board 300 is commonly manufactured for a maker A and a maker B, and is sequentially formed a rectangular first providing destination indicating region 310 for the maker A and a rectangular second providing destination indicating region 320 for the maker B, which the second providing destination indicating region 320 is the same shape and the same size as the first providing destination indicating region 310. In the first providing destination indicating region 310, a maker name (or mark) 311 of the maker A is silk printed. On the other hand, in the second providing destination indicating region 320, a maker name (or mark) 321 of the maker B is silk printed.

On a boundary line between two, first and second providing destination indicating regions 310 and 320, and boundary lines at both ends of the providing destination indicating regions, three parts mounting holes 331, 332 and 333 are provided. These parts mounting holes may serve as through holes provided on wiring of the circuit board 300.

When the circuit board 300 is to be provided for the maker B, a part 10 is mounted on the first providing destination indicating region 310 displaying the maker name 311 of the maker A to hide the maker name 311 of the maker A with the part 10. Conversely, when the circuit board 300 is to be provided for the maker A, the part 10 is mounted on the second providing destination indicating region 320 displaying the maker name 321 of the maker B to hide the maker name 321 of the maker B with the part 10. At this time, the part 10 is fixed to the circuit board 300 using two of three part mounting holes 331, 332 and 333.

Figure 2:
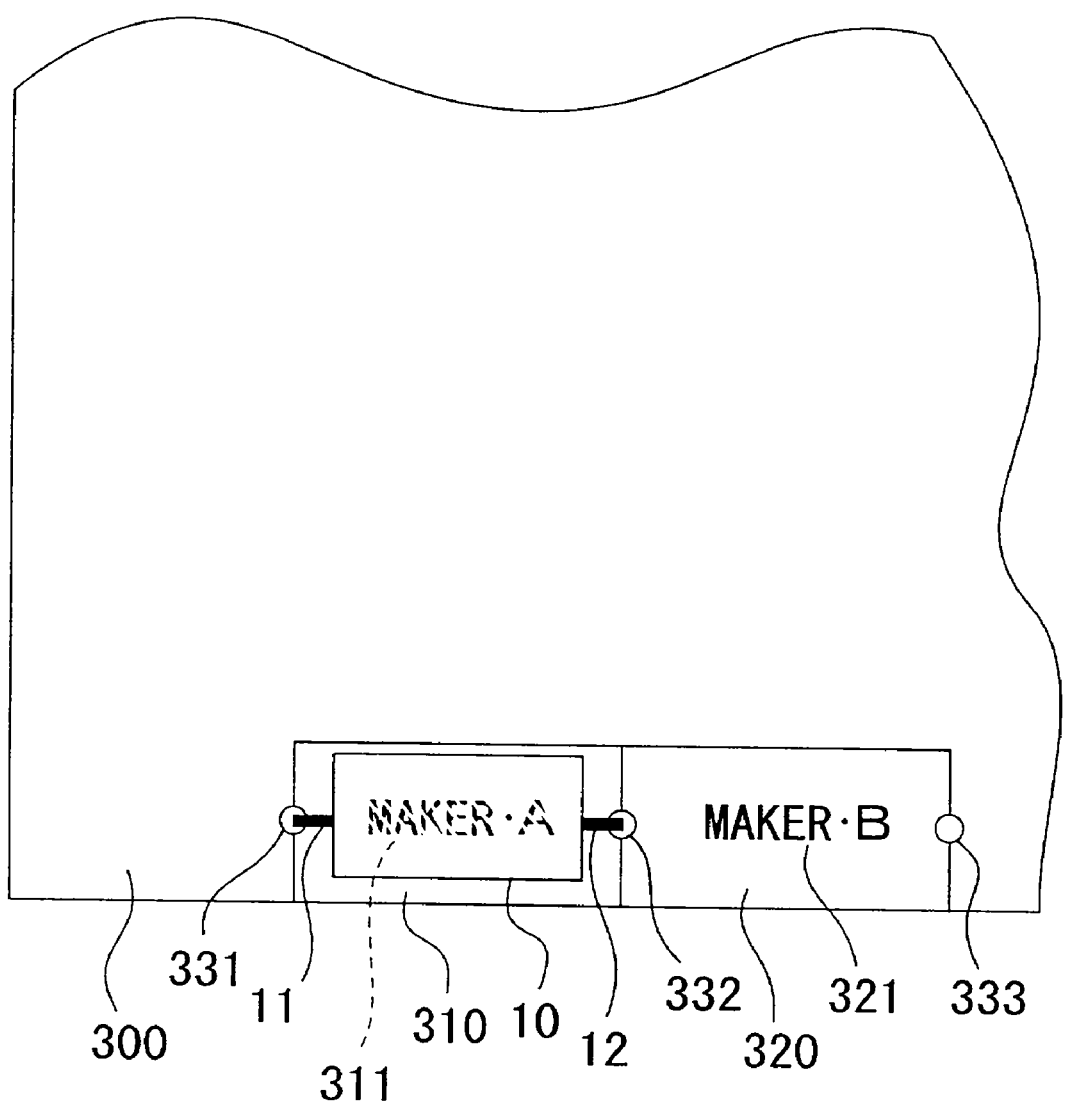
FIG. 2 is a plan view similar to FIG. 1 but illustrated in a condition where the provider indication is hidden by parts.

In the embodiment shown in FIG. 2, both terminals 11 and 12 of the part 10, such as capacitor or the like, are inserted into the part mounting holes 331 and 332 to electrically connect to wiring on the circuit board 200 by soldering for using the part 10 as a part of the circuit, and conjunction therewith, to hide the maker name 311 of the maker A by the part 10. The part 10 may be a dummy part not forming a part of the circuit on the circuit board 300.

Figure 3:
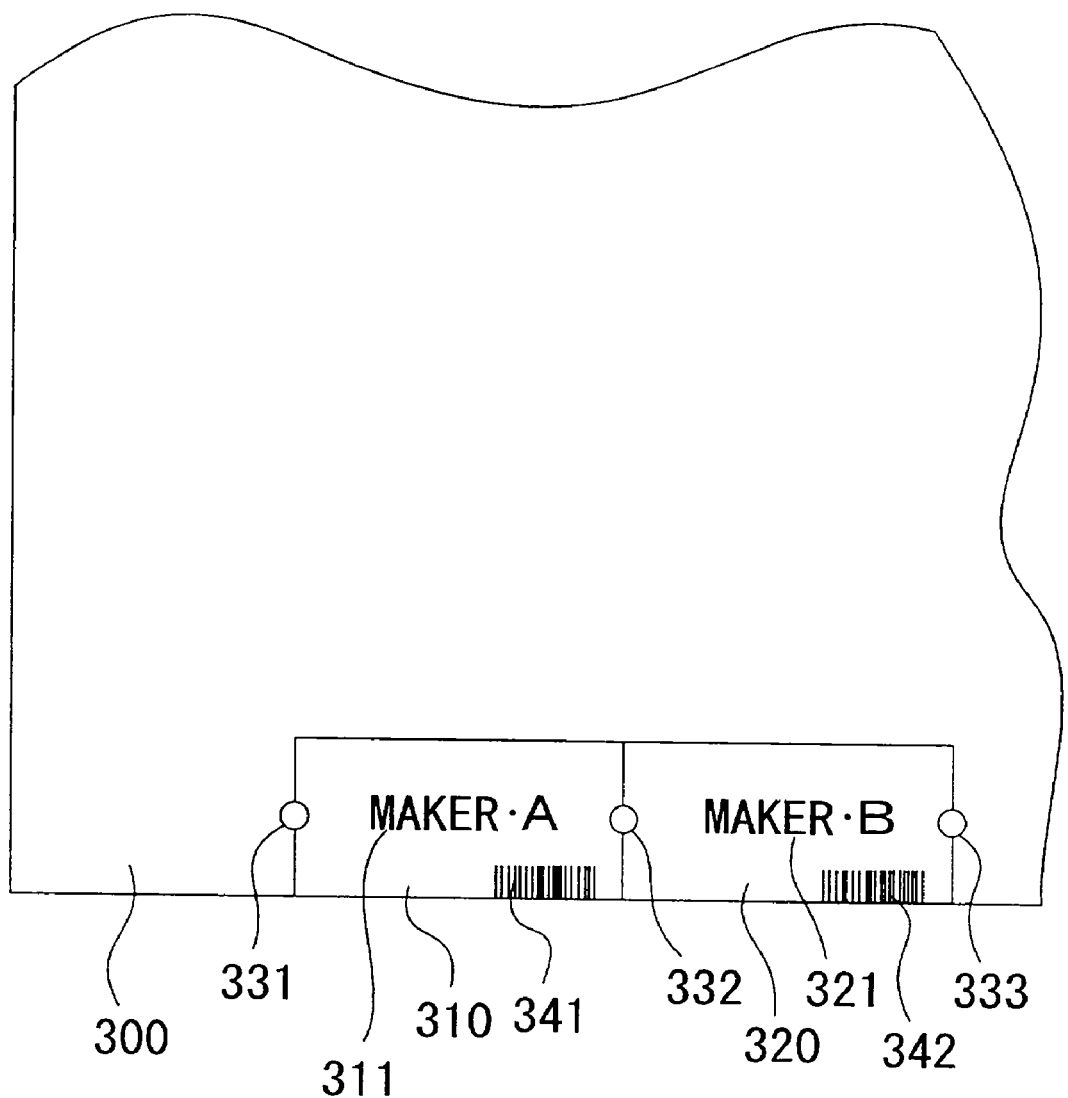
FIG. 3 is a plane view showing a modification of the embodiment shown in FIG. 1.

FIG. 3 shows a modification for the embodiment of FIG. 1. In respective of first and second providing destination indicating regions 310 and 320, manufacturing information 341 and 342 depending upon respective makers are indicated by bar codes. The manufacturing information 341 and 342 are to be used upon manufacturing and shipping by a manufacturing apparatus and/or shipping apparatus. For this purpose, the manufacturing information 341 and 342 may be identification information relating to construction of the parts corresponding to respective maker names 311 and 321. In case of manufacturing apparatus, by reading out the manufacturing information 341 and 342, a part specialized for the maker can be automatically mounted on the circuit board 300.

Furthermore, when a test standard is adopted by a maker, it is possible to embed a test circuit adapted to each maker in each providing destination indicating regions 310 and 320 with multi-layer structure of the circuit board 300. Such test circuit may be a coupon checking whether the impedance satisfies a predetermined value per each layer of the circuit board or not.

Figure 4:
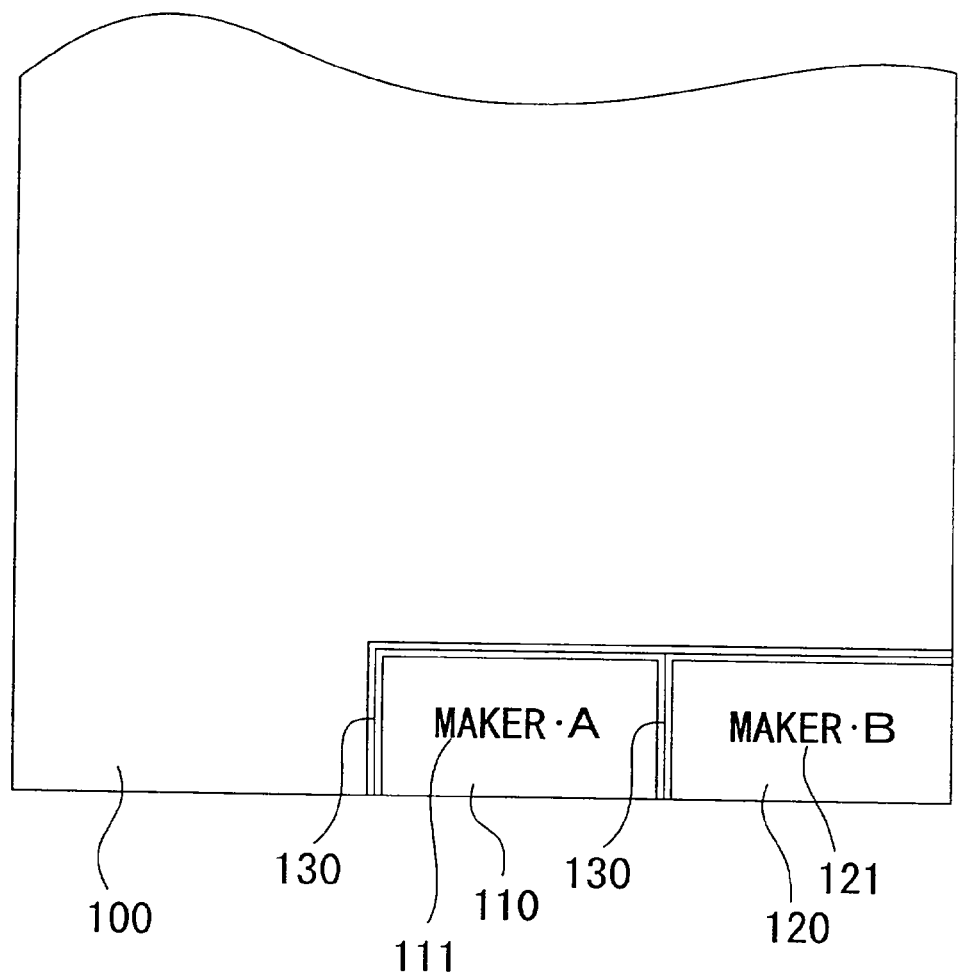
FIG. 4 is a plan view of major portion of another embodiment of the circuit board according to the present invention illustrated in a condition before unnecessary provider indication region is removed.
Figure 5:
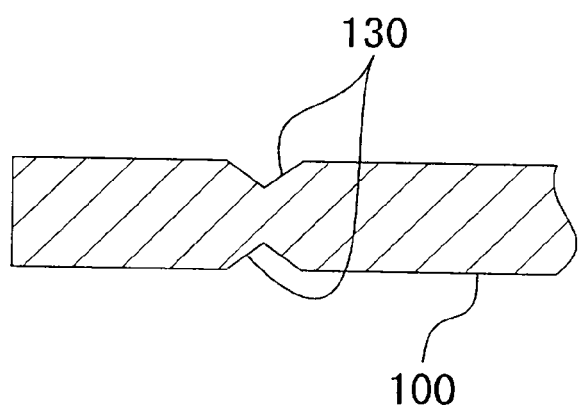
FIG. 5 is a partial enlarged section of another embodiment of the circuit board of FIG. 4.
Figure 6:
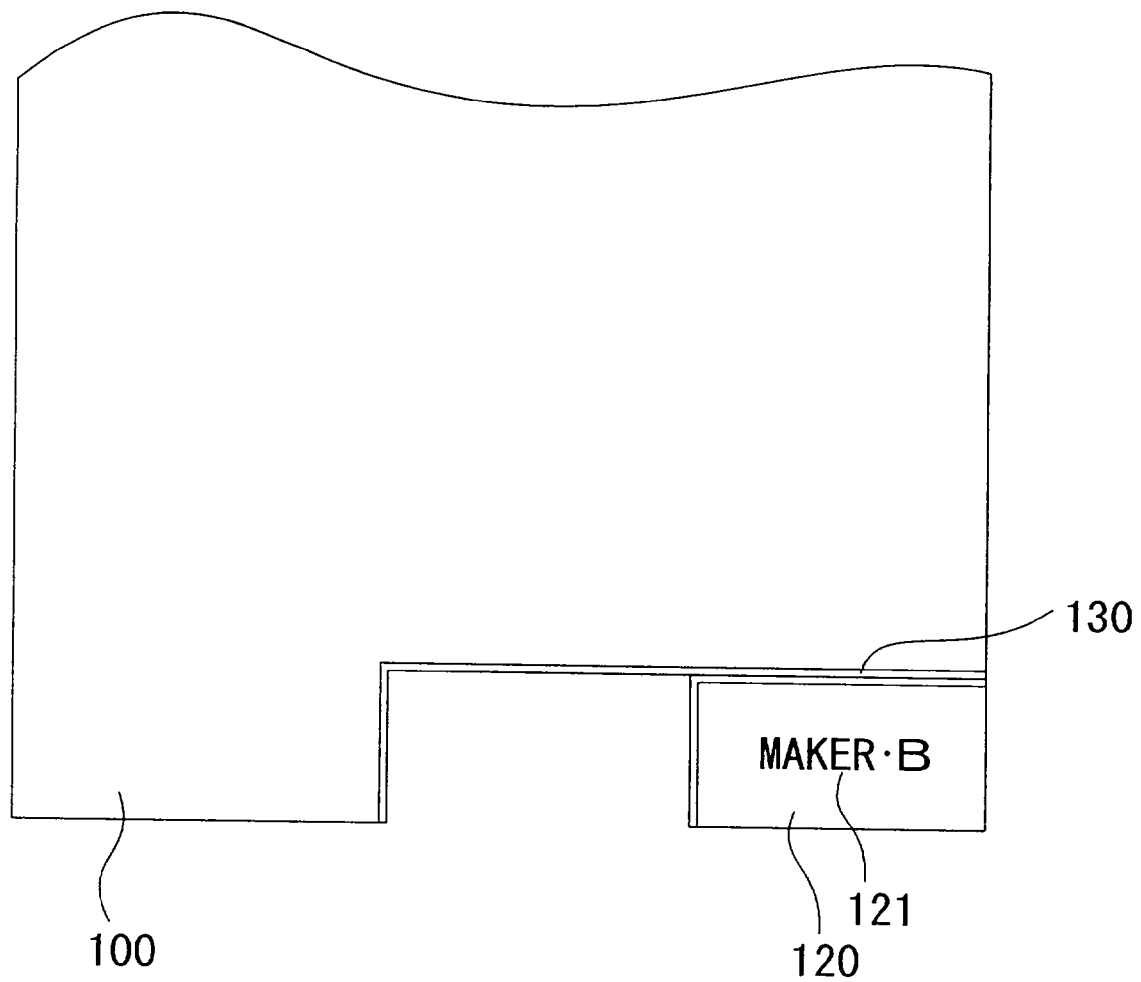
FIG. 6 is a plan view of the major portion of another embodiment of the circuit board of the present invention illustrated in a condition where the unnecessary providing destination indicating region is removed.

Next, another embodiment of the present invention will be discussed. Referring to FIG. 4, a circuit board 100 is common for the maker A and the maker B. In the end portion of the circuit board 100, a rectangular first providing destination indicating region 110 for the maker A and a second providing destination indicating region 120 for the maker B and having the same shape and same size as the first providing destination indicating region 110 are defined by a V-shaped cutting groove 130 on both of surface and back surfaces for reducing the thickness of the circuit board 100 as shown in FIG. 5. Then, a maker name 111 of the maker A is silk printed within the first providing destination indicating region 110 and a maker name 121 of the maker B is silk printed within the second providing destination indicating region 120.

In case of the circuit board 100, unnecessary one of the first providing destination indicating region 110 and the second providing destination indicating region 120 is cut along the cutting groove 130 and removed. Namely, when the circuit board 100 is for the maker B, for example, the first providing destination indicating region 110 is removed leaving the second providing destination indicating region 120. Removal of the first providing destination indicating region 110 can be easily done by manually applying a force for causing shearing along the cut groove 130 for reduced thickness in the V-shaped grooves on surface and back surface of the circuit board, and without damaging other portion.

Figure 7:
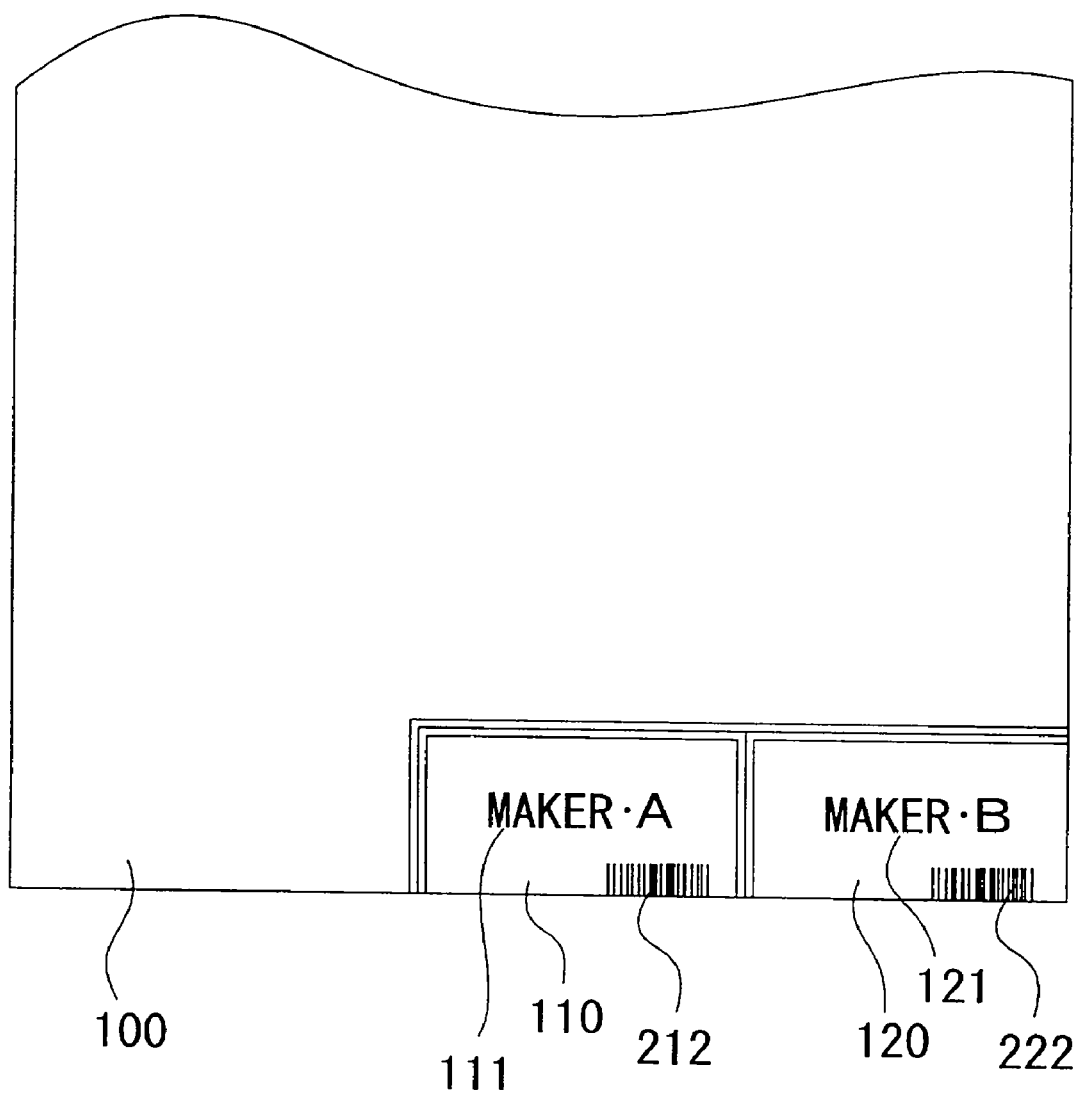
FIG. 7 is a plan view of a modification of another embodiment of FIG. 4.

FIG. 7 shows a modification for another embodiment of FIG. 4. For respective of the first and second providing destination indicating regions 110 and 120, manufacturing information 212 and 222 depending upon respective makers are provided in addition to the maker names 111 and 121 of the makers A and B. The manufacturing information 212 and 222 are indicated by bar codes similarly to the embodiment shown in FIG. 3. In this embodiment, by removing one of the providing destination indicating regions 110 or 120, unnecessary manufacturing information is also removed for preventing confusion to be caused by presence of the manufacturing information.

Furthermore, when a test standard is adopted by a maker, it is possible to embed a test circuit adapted to each maker in each providing destination indicating regions 110 and 120 with multi-layer structure of the circuit board 100. Such test circuit may be a coupon checking whether the impedance satisfies a predetermined value per each layer of the circuit board or not.

As set forth above, with the present invention, when the circuit board for a plurality of providing destinations are manufactured in the same factory, it becomes unnecessary to separately manufacture the circuit boards for each providing destination and the circuit board can be used in common to be economical. When the providing destination is specified to one, damaging of other portion of the circuit board by removal of one portion of the circuit board can be avoided.

It is also possible to indicate manufacturing information for respective providing destinations and/or to embed the test circuits for respective providing destinations, together with indication of the providing destinations.

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. A circuit board having at least a first providing destination indicating region on which a first providing destination is indicated and a second providing destination indicating region located adjacent said first providing destination indicating region and having a second providing destination indicated thereon, said first and second providing destination indicating regions being defined by thinned portion extending along boundaries of respective ones of said providing destination indicating regions so that said providing destination indicating regions other than that indicating an intended providing destination are removed.

2. A circuit board as set forth in claim 1, wherein manufacturing information depending upon respective providing destination is indicated in respective providing destination indicating regions.

3. A circuit board as set forth in claim 2, wherein said manufacturing information in each providing destination indicating region is a bar code.

4. A circuit board as set forth in claim 1, wherein a test circuit adapted to each providing destination is embedded in each providing destination indicating region.

5. A circuit board having at least a first providing destination indicating region on which a first providing destination is indicated and a second providing destination indicating region located adjacent said first providing destination indicating region and having a second providing destination indicated thereon, and part mounting portions provided in respective ones of said providing destination indicating regions, wherein part mounting portions are designed for receiving parts for hiding providing designations indicated on corresponding providing destination indicating region;

wherein said parts mounted on said providing destination indicating regions other than that indicating an intended providing destination, are dummy parts not forming a part of a circuit.

6. A circuit board as set forth in claim 5, wherein a part is mounted on selected one of said part mounting portions in corresponding one of first and second providing destination indicating regions other than that indicating an intended providing destination for hiding providing destination indicated thereon by said part.

7. A circuit board as set forth in claim 5, wherein the part mounting portions are provided on both ends of respective providing destination indicating regions.

8. A circuit board as set forth in claim 5, wherein said part mounting portion is a hole.

9. A circuit board as set forth in claim 5, wherein manufacturing information depending upon respective providing destination is indicated in respective providing destination indicating regions.

10. A circuit board as set forth in claim 9, wherein said manufacturing information in each providing destination indicating region is a bar code.

11. A circuit board as set forth in claim 5, wherein a test circuit adapted to each providing destination is embedded in each providing destination indicating region.

* * * * *